(12) United States Patent
White et al.

(10) Patent No.: US 8,733,279 B2
(45) Date of Patent: May 27, 2014

(54) PECVD PROCESS CHAMBER BACKING PLATE REINFORCEMENT

(75) Inventors: John M. White, Haywar, CA (US);
Shinichi Kurita, San Jose, CA (US);
Robin L. Tiner, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 976 days.

(21) Appl. No.: 12/037,885

(22) Filed: Feb. 26, 2008

(65) Prior Publication Data

US 2008/0268173 A1    Oct. 30, 2008

Related U.S. Application Data

(60) Provisional application No. 60/891,842, filed on Feb. 27, 2007.

(51) Int. Cl.
*C23C 16/00* (2006.01)
*H01L 21/306* (2006.01)
*C23F 1/00* (2006.01)

(52) U.S. Cl.
USPC .................. 118/723 E; 118/715; 156/345.34; 156/345.43

(58) Field of Classification Search
CPC ................................................. H01J 2237/3325
USPC ...... 118/715, 722, 723 R, 723 E; 156/345.43, 156/345.44, 345.45, 345.46, 345.47, 156/345.33, 345.34; 315/111.21
See application file for complete search history.

(56) References Cited

U.S. PATENT DOCUMENTS

| | | | |
|---|---|---|---|
| 5,318,600 | A | 6/1994 | Schlaikjer et al. |
| 5,766,364 | A | 6/1998 | Ishida et al. |
| 2005/0000430 | A1 | 1/2005 | Jang et al. |
| 2006/0054280 | A1 | 3/2006 | Jang |
| 2006/0060138 | A1 | 3/2006 | Keller et al. |

FOREIGN PATENT DOCUMENTS

| | | |
|---|---|---|
| JP | 2003-179037 A | 6/2003 |
| JP | 2006-121057 A | 5/2006 |
| WO | WO-2006056091 A1 | 6/2006 |

OTHER PUBLICATIONS

Office Action for Chinese Patent Application No. 200880006171.8 dated Feb. 24, 2011.
Office Action for Taiwan Patent Application No. 97106865 dated Feb. 10, 2012.
Office action for Japanese Patent Application No. 2009-550638 dated Jul. 23, 2013.
International Search Report and Written Opinion dated Aug. 4, 2008 for International Application No. PCT/US2008/055177.
Search Report for European Patent Application No. 08730880.5 dated Jun. 27, 2011.
Takehara et al., "The Latest PECVD Technology for Large-Size TFT-LCD," IDW, FMC5-2, Jan. 1, 2004, pp. 603-606.
Office Action for Japanese Patent Application No. 2009-55638 dated Jan. 8, 2013.

*Primary Examiner* — Maureen Gramaglia
(74) *Attorney, Agent, or Firm* — Patterson & Sheridan, LLP (57) ABSTRACT

The present invention generally comprises a backing plate reinforcement apparatus for use in a plasma enhanced chemical vapor deposition apparatus. When processing large area substrates, the backing plate extending across the chamber may also be quite large. By supporting a central area of the backing plate with a frame structure, the backing plate may be maintained substantially planar. Alternatively, as necessary, the contour of the backing plate may be adjusted to suit the particular needs of the process.

19 Claims, 5 Drawing Sheets

PECVD PROCESS CHAMBER BACKING PLATE REINFORCEMENT

CROSS-REFERENCE TO RELATED APPLICATIONS

This application claims benefit of U.S. Provisional Patent Application Ser. No. 60/891,842, entitled "PECVD Process Chamber Backing Plate Reinforcement", filed Feb. 27, 2007, which is herein incorporated by reference.

BACKGROUND OF THE INVENTION

1. Field of the Invention

Embodiments of the present invention generally relate to an apparatus for reinforcing the backing plate on a plasma enhanced chemical vapor deposition (PECVD) apparatus.

2. Description of the Related Art

Figure 7:
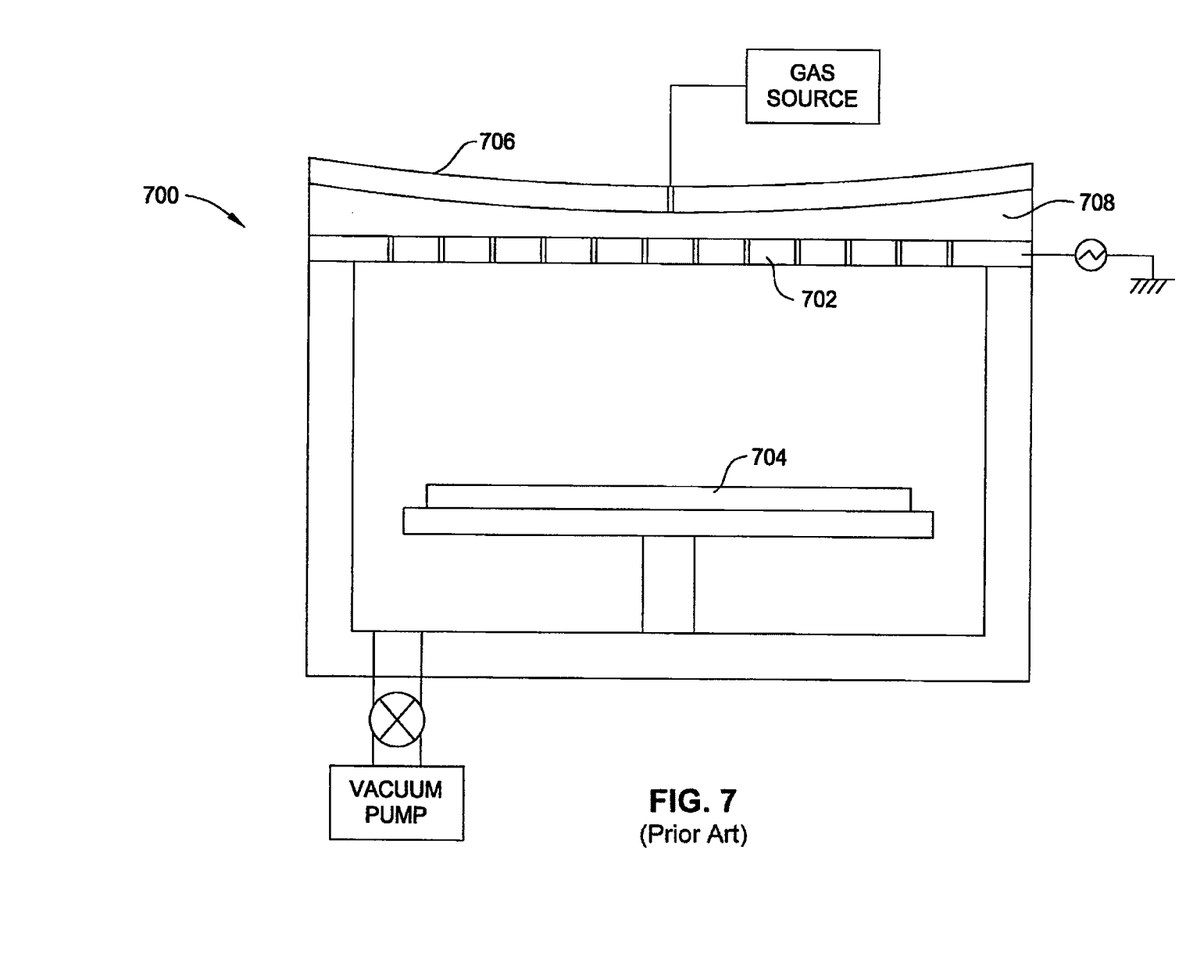
FIG. 7 is a PECVD apparatus 700 having a sagging backing plate.

Large area substrates may be used for the fabrication of numerous items used in society such as flat panel displays and solar cell panels. A large area substrate may exceed 2 square meters in surface area. To process these large area substrates, chamber size may also increase. One suitable apparatus that may be used to process large area substrates is a PECVD apparatus 700 as shown in FIG. 7. A substrate 704 is disposed in the processing chamber opposite to a gas distribution showerhead 702. A backing plate 706 is disposed behind the showerhead 702 to create a plenum 708 between the showerhead 702 and the backing plate 706 for distribution of processing gas behind the showerhead 702. For a PECVD chamber, the backing plate 706 may be at least as large as the large area substrate 704. Hence, in a PECVD apparatus for processing large area substrates, the backing plate may exceed 2 square meters in surface area. By simply scaling up a processing chamber and increasing its surface area, the size and weight of the backing plate may eventually result in the center of the backing plate 706 sagging as shown in FIG. 7 when the backing plate 706 retains the thickness of the smaller chambers. Therefore, there is a need in the art for a backing plate of sufficient size and mechanical strength to permit processing of large area substrates.

SUMMARY OF THE INVENTION

The present invention generally relates to a backing plate reinforcement apparatus for use in a plasma enhanced chemical vapor deposition apparatus. When processing large area substrates, the backing plate extending across the chamber may also be quite large. By supporting a central area of the backing plate with a frame structure, the backing plate may be maintained substantially planar. Alternatively, as necessary, the contour of the backing plate may be adjusted to suit the particular needs of the process.

In one embodiment, a plasma enhanced chemical vapor deposition apparatus is disclosed. The apparatus comprises a chamber body, a backing plate coupled with the chamber body and enclosing a processing area, and a frame structure disposed outside the processing area and coupled with a center area of the backing plate.

In another embodiment, a backing plate reinforcement apparatus is disclosed. The apparatus comprises a bridge section, a plurality of legs extending from edge portions of the bridge section, and a support element suspended below a center portion of the bridge section, the support element suspended by one or more anchor elements that extend through the center portion of the bridge section and fasten to a top surface of the bridge section. The support element comprises one or more fasteners extending through the element and an electrically insulating element coupled with each fastener.

In yet another embodiment, a method of controlling a shape of a backing plate is disclosed. The method comprises supporting a center portion of the backing plate with a support element extending from a frame assembly disposed above the backing plate and adjusting a distance that the support ring extends from the frame assembly to control the shape of the backing plate.

In still another embodiment, a plasma enhanced chemical vapor deposition method is disclosed. The method comprises depositing a layer of material onto a substrate by plasma enhanced chemical vapor deposition in an apparatus, the apparatus comprising a backing plate coupled with a gas distribution showerhead, and a backing plate support coupled with the backing plate and disposed on a side of the backing plate opposite to the gas distribution showerhead, and adjusting a shape of the backing plate in the apparatus in response to a measured parameter of the depositing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide an apparatus and method for supporting a backing plate in a processing chamber. In one embodiment, the center area of the backing plate is coupled with a support ring that maintains the backing plate in a substantially planar orientation. It is understood that the substrate to be processed may be any suitable substrate such as a semiconductor substrate, a flat panel display substrate, a solar panel substrate, etc.

Figure 1:
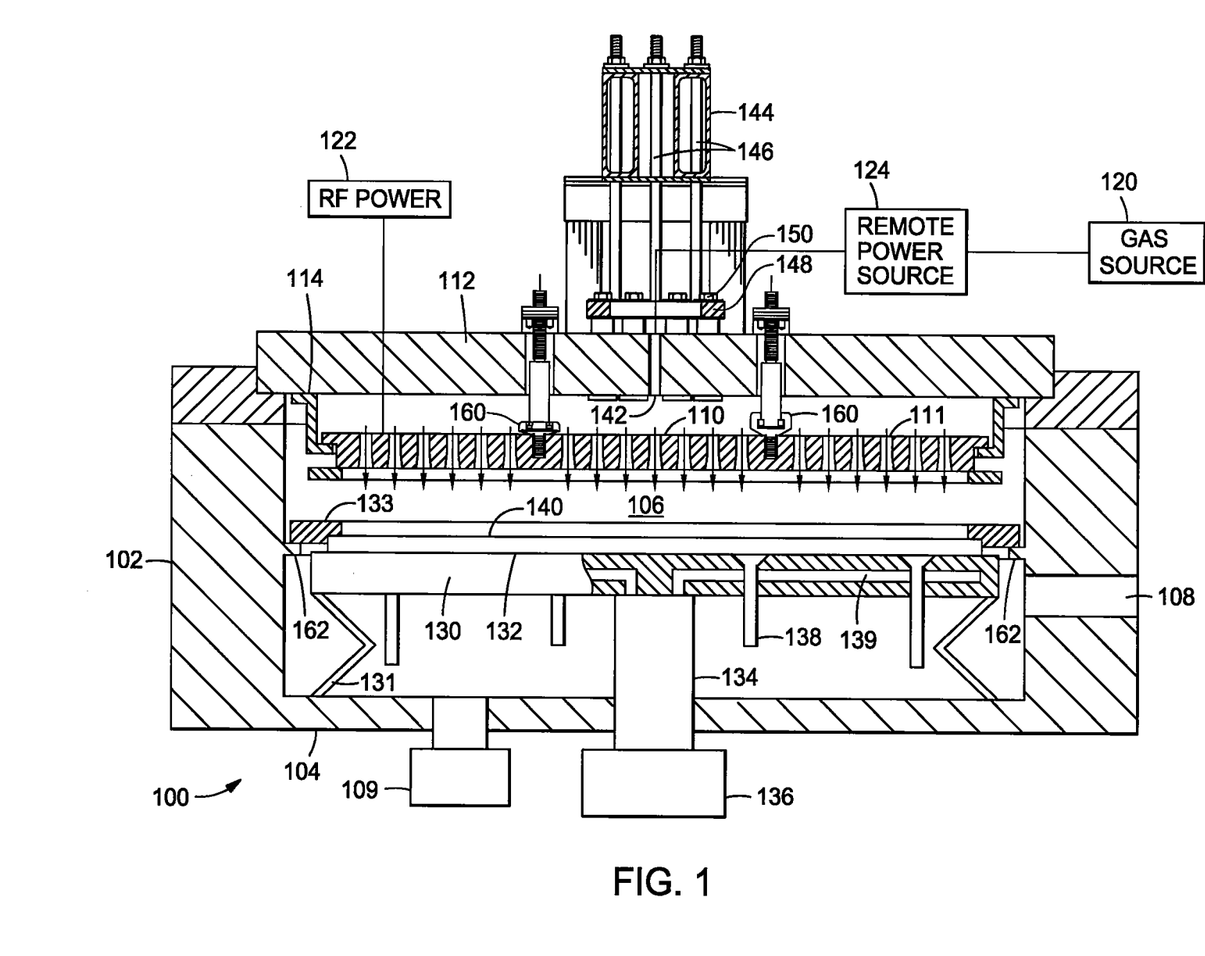
FIG. 1 is a cross sectional view of a PECVD apparatus according to one embodiment of the invention.

FIG. 1 is a cross sectional view of a PECVD apparatus according to one embodiment of the invention. The apparatus includes a chamber 100 in which one or more films may be deposited onto a substrate 140. One suitable PECVD apparatus which may be used is available from AKT, a subsidiary of Applied Materials, Inc., located in Santa Clara, Calif. While the description below will be made in reference to a PECVD apparatus, it is to be understood that the invention is equally applicable to other processing chambers as well, including those made by other manufacturers.

The chamber 100 generally includes walls 102, a bottom 104, a showerhead 110, and substrate support 130 which define a process volume 106. The process volume 106 is accessed through a valve 108 such that the substrate 140 may be transferred in and out of the chamber 100. The substrate support 130 includes a substrate receiving surface 132 for supporting a substrate 140. One or more stems 134 may be coupled to a lift system 136 to raise and lower the substrate support 130. A shadow ring 133 may be optionally placed over the periphery of the substrate 140. Lift pins 138 are moveably disposed through the substrate support 130 to move a substrate 140 to and from the substrate receiving surface 132. The substrate support 130 may also include heating and/or cooling elements 139 to maintain the substrate support 130 at a desired temperature. The substrate support 130 may also include grounding straps 131 to provide RF grounding at the periphery of the substrate support 130.

The showerhead 110 may be coupled to a backing plate 112 at its periphery by a suspension 114. The showerhead 110 may also be coupled to the backing plate 112 by one or more coupling supports 160 to help prevent sag and/or control the straightness/curvature of the showerhead 110. In one embodiment, twelve coupling supports 160 may be used to couple the showerhead 110 to the backing plate 112. The coupling supports 160 may include a fastening mechanism such as a nut and bolt assembly. In one embodiment, the nut and bolt assembly may be made with an electrically insulating material. In another embodiment, the bolt may be made of a metal and surrounded by an electrically insulating material. In still another embodiment, the showerhead 110 may be threaded to receive the bolt. In yet another embodiment, the nut may be formed of an electrically insulating material. The electrically insulating material helps to prevent the coupling supports 160 from becoming electrically coupled to any plasma that may be present in the chamber. Additionally and/or alternatively, a center coupling mechanism may be present to couple the backing plate 112 to the showerhead 110. The center coupling mechanism may surround the ring 148 (discussed below) and be suspended from a bridge assembly. In still another embodiment, the coupling supports 160 may comprise a fastener threaded into the showerhead 110. The fastener may have a slotted opening for receiving a rod that is coupled to the backing plate 112. The rod may be coupled to the backing plate 112 with a vacuum seal.

A gas source 120 is coupled to the backing plate 112 to provide gas through a gas outlet 142 in the backing plate 112 and through gas passages 111 in the showerhead 110 to the substrate receiving surface 132. A vacuum pump 109 is coupled to the chamber 100 to control the process volume 106 at a desired pressure. A RF power source 122 is coupled to the backing plate 112 and/or to the showerhead 110 to provide a RF power to the showerhead 110. The RF power creates an electric field between the showerhead 112 and the substrate support 130 so that a plasma may be generated from the gases between the showerhead 110 and the substrate support 130. Various frequencies may be used, such as a frequency between about 0.3 MHz and about 200 MHz. In one embodiment, the RF power source is provided at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 to that a remote plasma is generated and provided to clean chamber components. The cleaning gas may be further excited by the RF power source 122 provided to the showerhead. Suitable cleaning gases include by are not limited to $NF_3$, $F_2$, and $SF_6$.

The spacing between the top surface of the substrate 140 disposed on the substrate receiving surface 132 and the showerhead 110 may be between about 400 mil and about 1,200 mil. In one embodiment, the spacing may be between about 400 mil and about 800 mil. The distance between the backing plate 112 and the showerhead 110 may be adjusted.

The backing plate 112 may be supported by a bridge assembly 144. One or more anchor bolts 146 may extend down from the bridge assembly 144 to a support ring 148. The support ring 148 may be coupled with the backing plate 112 by one or more bolts 150. The support ring 148 may be coupled with the backing plate 112 substantially in the center of the backing plate 112. The center of the backing plate 112 is the area of the backing plate 112 with the least amount of support in absence of the support ring 148. Therefore, supporting the center area of the backing plate 112 may reduce and/or prevent sagging of the backing plate.

In one embodiment, the support ring 148 may be coupled to an actuator that controls the shape of the backing plate 112 so that the center of the backing plate 112 may be raised or lowered relative to the edges of the backing plate 112. It is contemplated that by raising the center area of the backing plate, a vortex-like flow may be created to enable atomic layer deposition processes to be performed on large area substrates. The movement of the backing plate 112 may occur in response to a metric obtained during processing. In one embodiment, the metric is the thickness of the layer being deposited. The movement of the backing plate 112 may occur simultaneous with the processing.

The support ring 148 may be integral with or separate from the supporting mechanism for the showerhead 110. In one embodiment, one or more supporting elements may couple the showerhead 110 to the backing plate 112 at various locations while the support ring 148 is coupled to a center area of the backing plate 112. In another embodiment, a center mounted coupling mechanism may be used to couple the backing plate 112 to the showerhead 110 while the support ring 148 is coupled to the center area of the backing plate 112. When the showerhead 110 is center supported in addition to the support ring 148 of the backing plate 112, the support ring 148 of the backing plate 112 may be disposed within the center support for the showerhead 110.

The distance between the bridge assembly 144 and the backing plate 112 may be adjusted as desired. In one embodiment, the distance between the bridge assembly 144 and the backing plate 112 may be adjusted in response to a measured metric of a processing condition. Additionally, when adjusting the distance between the bridge assembly 144 and the backing plate 112, the distance between the showerhead 110 and the substrate may be adjusted whenever the showerhead 110 is coupled with the backing plate 112.

Figure 2:
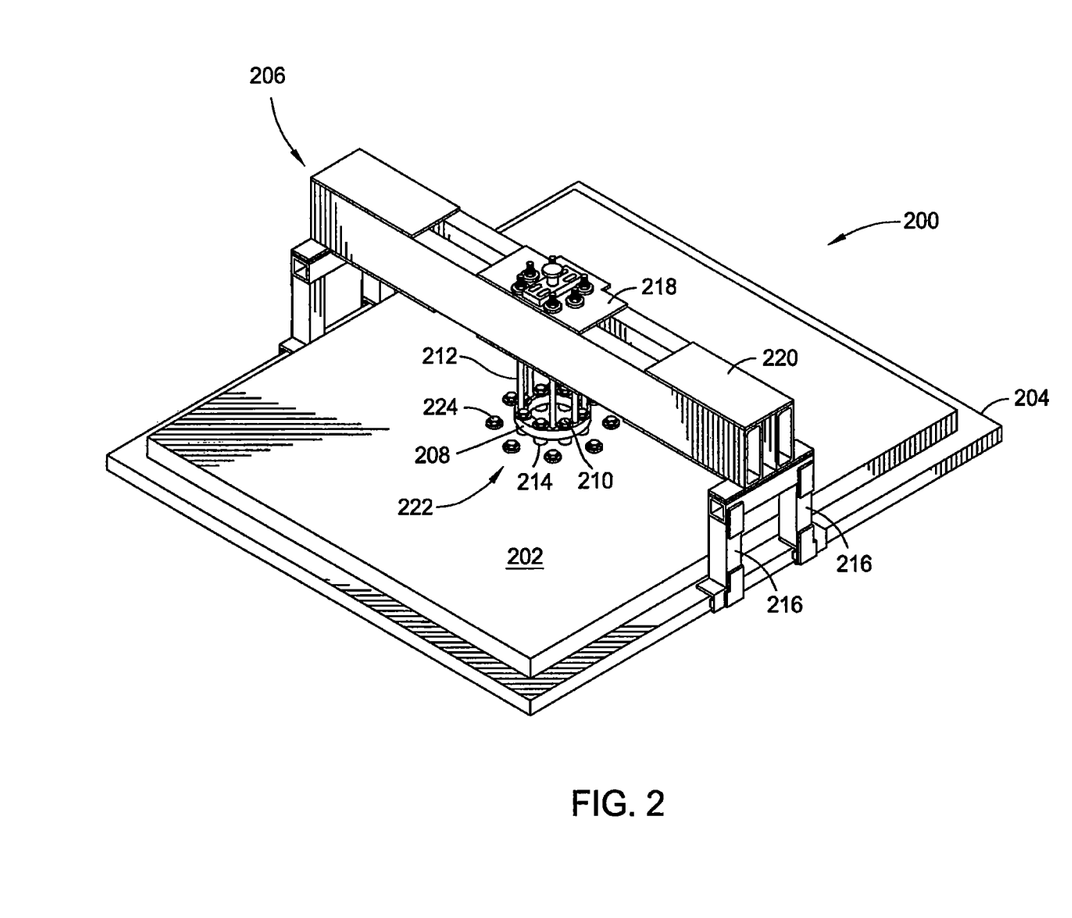
FIG. 2 is a top perspective view of a backing plate frame structure according to one embodiment of the invention.

FIG. 2 is a top perspective view of a backing plate frame structure 200 according to one embodiment of the invention. A plurality of coupling mechanisms 224 may be visible which couple a showerhead to the backing plate to prevent showerhead plate sagging. In one embodiment, twelve coupling mechanisms 224 may be present. The edges of the backing plate 202 may rest on a lid body 204. The center portion 222 of the backing plate, however, may be supported in the center by a support ring 208 suspended from a center area 218 of a bridge assembly 206. A bridge section 220 of the bridge assembly 206 may span the width of the backing plate 202. The edges of the bridge section 220 may be supported by one or more legs 216 that are coupled with the lid body 204.

The support ring 208 may be suspended from the center area 218 of the bridge section 220 by one or more anchor bolts 212. The material of the anchor bolts may be any well known material of sufficient strength to support a large area backing plate 202. In one embodiment, the anchor bolts 212 may comprise stainless steel. The support ring 208 may be coupled with the backing plate 202 by one or more bolts 210. The bolts 210 may be electrically insulated from the backing plate 202 by insulators 214. The insulators 214 may be made of any well known electrically insulating material. In one embodiment, the insulators are 214 ceramic. It is to be understood that while bolts 210, 212 have been described for coupling the support ring 208 to the backing plate 202, and for coupling the support ring 208 to the center area 218 of the bridge section 220, any fastening mechanism capable of coupling the elements together is contemplated.

Figure 3:
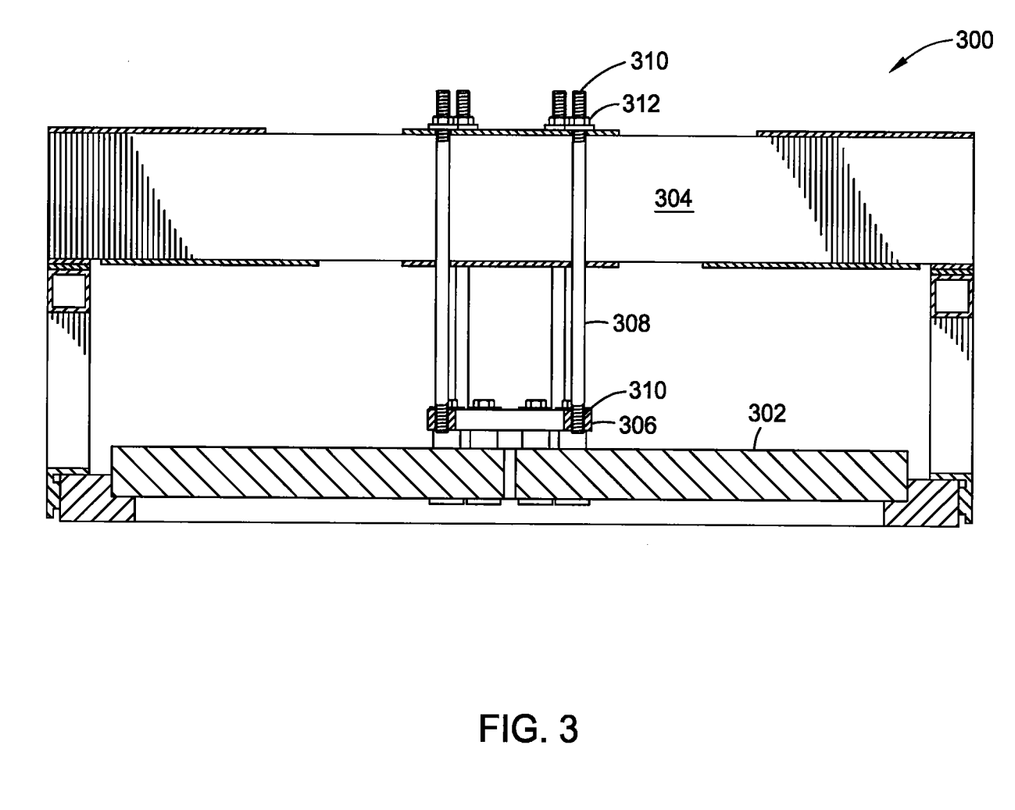
FIG. 3 is a cross sectional view of a top portion of a PECVD apparatus according to another embodiment of the invention.

FIG. 3 is a cross sectional view of a top portion of a PECVD apparatus 300 according to another embodiment of the invention. The support ring 306 coupled to the backing plate 302 may be suspended from a bridge assembly 304 by one or more anchor bolts 308. The anchor bolts 308 may be threaded at each end 310 for coupling to the support ring 306 and the bridge assembly 304. At the bridge assembly 304, a fastening mechanism 312, such as a nut, may be threadedly coupled to the threaded end 310 of the anchor bolt 308.

At the support ring 306, the anchor bolts 308 may be threadedly coupled to the support ring 306. The support ring 306 may have a threaded portion for receiving the threaded end 310 of the anchor bolt 308. By threadedly attaching the anchor bolt 308 to the support ring 306, a fastening mechanism, such as a nut, may not be necessary on the underside of the support ring 306. A nut on the underside of the support ring 306 may lead to undesired electrical coupling of the backing plate 302 to the bridge assembly 304. However, in one embodiment, a nut may be disposed on the underside of the support ring 306 to couple with the anchor bolt 308. In one embodiment, insulating fastening mechanisms may be used to couple the support ring 306 to the anchor bolts 308. If an insulating nut is used to couple the anchor bolts 308 to the support ring 306, the support ring 306 may or may not be threaded for receiving the anchor bolts 308. By using both a threaded support ring 306 and a nut, the anchor bolts 308 may be further secured to the support ring 306. When only a nut is used to couple the anchor bolts 308 to the support ring 306, the portion of the support ring 306 through which the anchor bolts 308 pass may be substantially straight sided.

Figure 4:
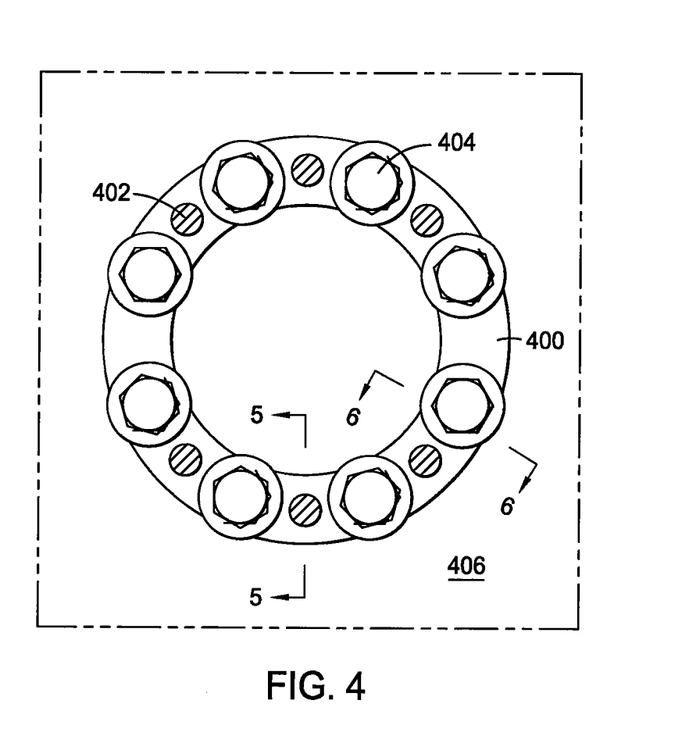
FIG. 4 is a top view of the support ring according to one embodiment of the invention.

FIG. 4 is a top view of a support ring 400 coupled to a backing plate 406 according to one embodiment of the invention. Anchor bolts 402 and bolts 404 have also been shown. While one or more anchor bolts 402 may be present, six anchor bolts 402 have been shown. It is to be understood that more or less anchor bolts 402 may be used. Additionally, while eight bolts 404 coupling the support ring 400 to the backing plate 406 are shown, it is to be understood that more or less bolts 404 may be used.

Figure 5:
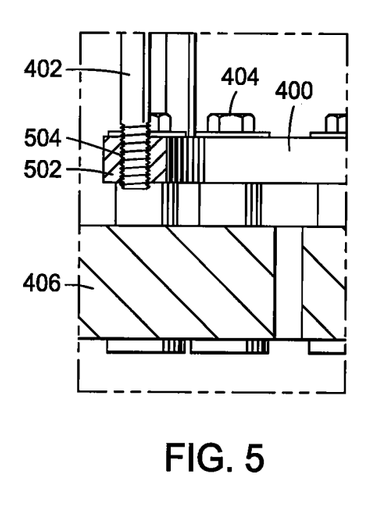
FIG. 5 is a cut away view of the anchor bolt mounted to the support ring of FIG. 4.

FIG. 5 is a cut away view of the anchor bolt 402 mounted to the support ring 400 of FIG. 4. The anchor bolt 402 may have a threaded end 504 coupled with a threaded receiving portion 502 of the support ring 400. As discussed above, the threaded end 504 may or may not additionally have a fastening mechanism in addition to, or in place of the threaded receiving portion 502. In one embodiment, the threaded end 504 of the anchor bolt 402 may be coated with an electrically insulating material to reduce any electrical coupling between the backing plate 406 and the anchor bolt 402.

Figure 6:
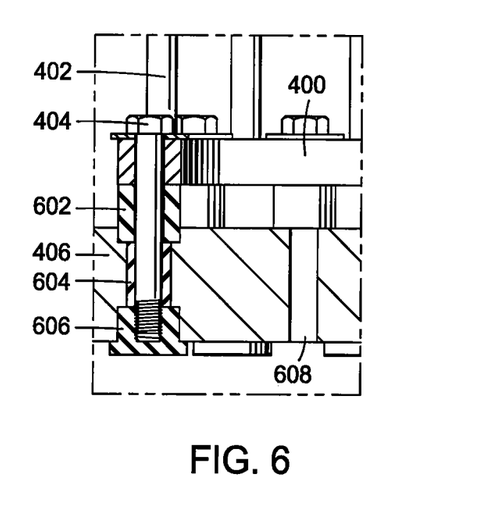
FIG. 6 is a cut away view of the bolts through the backing plate and support ring of FIG. 4.

FIG. 6 is a cut away view of the bolts 404 through the backing plate 406 and support ring 400 of FIG. 4. Between the support ring 400 and the backing plate 406, the bolts 404 may be electrically isolated by an insulating washer 602. In one embodiment, the insulating washer 602 may be countersunk into the backing plate 406.

The end of the bolt 404 may be threadedly coupled to a threaded insulating nut 606 on the underside of the backing plate 406. The insulating nut 606 may be countersunk into the backing plate 406. The threaded end of the bolt 404 may not extend through the insulating nut 606. If the threaded end of the bolt 404 extends through the insulating nut 606, then the bolt 404 will be exposed to any plasma provided through the opening 608 in the backing plate 406. By exposing the bolt 404 to the plasma, the bolt 404 will not be electrically insulated from the backing plate 406 and thus, may provide a path to ground. Thus, the insulating nut 606 may function as an insulating cap for the bolt 404.

Within the backing plate 406, the bolt 404 may be electrically insulated from the backing plate 406 by an insulating sleeve 604 that extends between the insulating nut 606 and the insulating washer 602. In one embodiment, the insulating material for each of the insulating washer 602, the insulating sleeve 604, and the insulating nut 606 may comprise a ceramic material. It is contemplated that any well known electrically insulating material may be used for each of the insulating washer 602, the insulating sleeve 604, and the insulating nut 606. In one embodiment, the insulating washer 602, insulating sleeve 604, and insulating nut 606 may comprise a unitary piece of insulating material.

While the foregoing is directed to embodiments of the present invention, other and further embodiments of the invention may be devised without departing from the basic scope thereof, and the scope thereof is determined by the claims that follow.

The invention claimed is:

1. A plasma enhanced chemical vapor deposition apparatus, comprising:
    a chamber body;
    a backing plate coupled with the chamber body and enclosing a processing area of sufficient size to process large area substrates;
    a frame structure disposed outside the processing area and outside the chamber body, such that at least a portion of the frame structure is disposed above both the backing plate and the chamber body and is accessible externally to the backing plate and the chamber body, wherein the frame structure is coupled with a center area of the backing plate and supports the center area; and
    a lid body coupled to the chamber body, the lid body at least partially supporting the backing plate, and wherein the frame structure further comprises:
    a plurality of legs coupled with at least one of the lid body and the chamber body, and extending above at least a portion of the chamber body;
    a bridge section spanning the backing plate and supported above the backing plate by the plurality of legs, the bridge section having a center area disposed a distance above the center area of the backing plate; and
    a support element suspended below the center area of the bridge section, and coupled between the center area of the bridge section and the center area of the backing plate, wherein the support element is coupled with the center area of the backing plate by at least a first fastener, and the support element is coupled with the center area of the bridge section by at least a second fastener.

2. The apparatus of claim 1, wherein at least one of the fasteners further comprises:
a plurality of bolts extending through the support element and the backing plate, wherein each of the plurality of bolts are electrically insulated from the backing plate.

3. The apparatus of claim 2, further comprising:
an insulating washer coupled between each of the plurality of bolts;
an insulating sleeve extending through the support element and surrounding each of the plurality of bolts; and
an insulating nut coupled with each of the plurality of bolts.

4. The apparatus of claim 3, wherein the insulating washer, the insulating sleeve, and the insulating nut comprise ceramic material.

5. The apparatus of claim 3, wherein the insulating washer, insulating sleeve, and the insulating nut comprise a unitary piece of insulating material.

6. The apparatus of claim 1, wherein at least one of the fasteners further comprises:
a plurality of anchor bolts extending between the support element and the center area of the bridge section.

7. The apparatus of claim 6, wherein the anchor bolts extend through the center area of the bridge section and are adjustably coupled thereto.

8. The apparatus of claim 1, wherein the plurality of legs comprise one or more first legs extending from a first portion of one or more of the lid body and the chamber body, and one or more second legs extending from a second portion of one or more of the lid body and the chamber body disposed opposite to the first portion, wherein the bridge section spans across the backing plate and is coupled to both the one or more first legs and the one or more second legs.

9. A plasma enhanced chemical vapor deposition apparatus, comprising:
a chamber body;
a backing plate coupled with the chamber body and enclosing a processing area; and
a frame structure disposed outside the processing area and above the chamber body and coupled with a center area of the backing plate, wherein the frame structure further comprises:
a bridge section spanning the backing plate and having a center area;
a plurality of legs extending from edge portions of the bridge section; and
a support element coupled between the center area of the bridge section and the center area of the backing plate such that the frame structure supports the center area.

10. The apparatus of claim 9, further comprising:
a lid body coupled to the chamber body and at least partially supporting the backing plate, wherein the plurality of legs are coupled with at least one of the lid body and the chamber body and extending therefrom, the support element is coupled with the center area of the backing plate by at least one first fastener, and the support element is coupled with the center area of the bridge section by at least one second fastener.

11. The apparatus of claim 10, wherein at least one of the fasteners further comprises:
a plurality of bolts extending through the support element and the backing plate, wherein each of the plurality of bolts are electrically insulated from the backing plate.

12. The apparatus of claim 11, further comprising:
an insulating washer coupled between each of the plurality of bolts;
an insulating sleeve extending through the support element and surrounding each of the plurality of bolts; and
an insulating nut coupled with each of the plurality of bolts.

13. The apparatus of claim 12, wherein the insulating washer, the insulating sleeve, and the insulating nut comprise ceramic material.

14. The apparatus of claim 12, wherein the insulating washer, insulating sleeve, and the insulating nut comprise a unitary piece of insulating material.

15. The apparatus of claim 10, wherein the at least one second fastener further comprises:
a plurality of anchor bolts extending between the support element and the center area of the bridge section.

16. The apparatus of claim 15, wherein the anchor bolts extend through the center area of the bridge section and are adjustably coupled thereto.

17. The apparatus of claim 10, wherein the plurality of legs comprise one or more first legs extending from a first portion of one or more of the lid body and the chamber body, and one or more second legs extending from a second portion of one or more of the lid body and the chamber body disposed opposite to the first portion, wherein the bridge section spans across the backing plate and is coupled to both the one or more first legs and the one or more second legs.

18. A plasma enhanced chemical vapor deposition apparatus, comprising:
a chamber body;
a backing plate coupled with the chamber body and enclosing a processing area of sufficient size to process large area substrates; and
a frame structure disposed outside the processing area and coupled with a center area of the backing plate, wherein the frame structure further comprises:
a bridge section spanning the backing plate and having a center area disposed a distance above the chamber body; and
a support element coupled between the center area of the bridge section and the center area of the backing plate, such that the frame structure supports the center area of the backing plate and at least a portion of the support element is accessible externally to the backing plate and the chamber body.

19. The apparatus of claim 18, wherein the frame structure further comprises a plurality of legs extending from edge portions of the bridge section in an area between the bridge section and the chamber body.

* * * * *

UNITED STATES PATENT AND TRADEMARK OFFICE
CERTIFICATE OF CORRECTION

| | | |
|---|---|---|
| PATENT NO. | : 8,733,279 B2 | Page 1 of 1 |
| APPLICATION NO. | : 12/037885 | |
| DATED | : May 27, 2014 | |
| INVENTOR(S) | : White et al. | |

It is certified that error appears in the above-identified patent and that said Letters Patent is hereby corrected as shown below:

Title Page, Inventors (75):

Delete "Haywar" and insert --Hayward-- therefor.

Signed and Sealed this
Ninth Day of September, 2014

Michelle K. Lee
*Deputy Director of the United States Patent and Trademark Office*